(12) United States Patent
Banerjee et al.

(10) Patent No.: US 9,111,066 B2
(45) Date of Patent: Aug. 18, 2015

(54) CLOCK TREE DESIGN

(71) Applicant: TEXAS INSTRUMENTS INCORPORATED, Dallas, TX (US)

(72) Inventors: Dean Kumar Banerjee, Maple Valley, TX (US); Timothy Paul Toroni, Auburn, WA (US); Robert Charles Farrow, Jr., Dallas, TX (US); Valerie Way Chang, Sunnyvale, CA (US); Brandon Micah Hoppe, Wylie, TX (US); Arvind Sridhar, Bellevue, WA (US); Makram Mounzer Mansour, San Jose, CA (US); Khang Duy Nguyen, Bellevue, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/080,496

(22) Filed: Nov. 14, 2013

(65) Prior Publication Data
US 2015/0135152 A1    May 14, 2015

(51) Int. Cl.
*G06F 17/50* (2006.01)
(52) U.S. Cl.
CPC ................................. *G06F 17/5081* (2013.01)

(58) Field of Classification Search
CPC ............ G06F 17/5031; G06F 17/5036; G06F 17/5068; G06F 17/5022; G06F 17/50505; G06F 17/5045; G06F 17/5054; G06F 17/5072; G06F 17/5077; G06F 17/5081
USPC .................................................. 716/113, 139
See application file for complete search history.

(56) References Cited

U.S. PATENT DOCUMENTS 7,111,239 B2 *   9/2006   Morris-Yates ................. 715/709
2004/0177334 A1 *   9/2004   Horan et al. ..................... 716/18

* cited by examiner

*Primary Examiner* — Vuthe Siek
(74) *Attorney, Agent, or Firm* — Alan A. R. Cooper; Frank D. Cimino

(57) ABSTRACT

A clock tree design tool is described which receives input from a user via a graphical user interface (GUI) through a first window, the input including an indication of an output clock frequency. The tool also detects selection by the user of a soft control and, as a result of detecting selection of the soft control, generates a plurality of clock tree solutions. The tool further causes a graphical form of a highlighted one of the clock tree solutions to be displayed in a second window of the GUI. An algorithm for generating the various clock tree solutions is also disclosed.

17 Claims, 16 Drawing Sheets

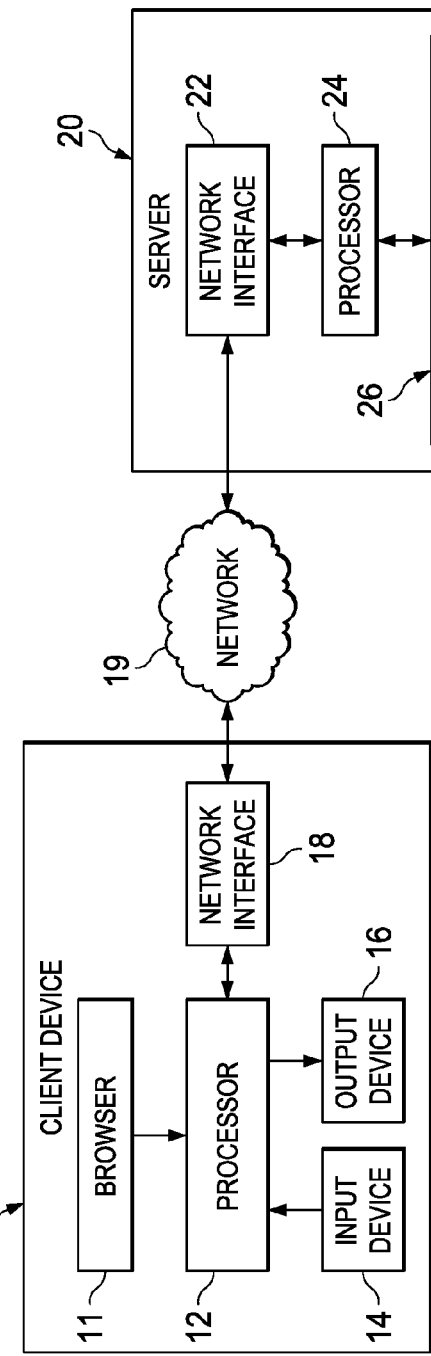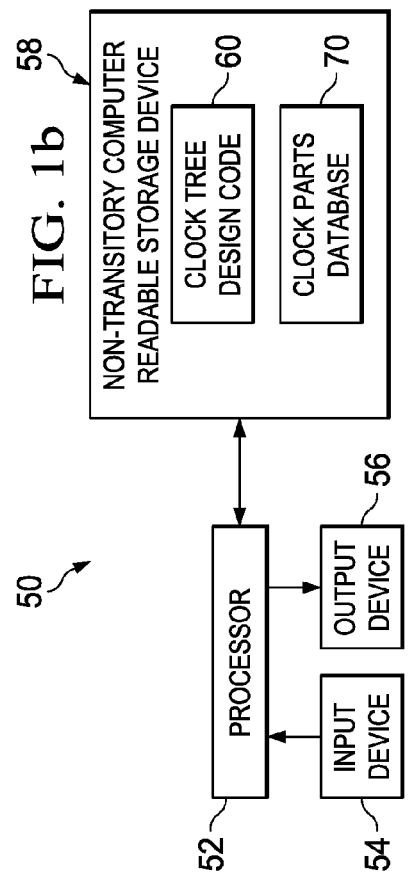

FIG. 2a

Check Design Entry

Fixed Output Frequencies

[Add] 114  [Delete] 116  Double-click field to edit.

| Name | MHz | Format | Count | Freq. Group |
|---|---|---|---|---|
| fixed0 | 24 | CMOS | 1 | |
| fixed1 | 27 | CMOS | 1 | |
| fixed2 | 25 | CMOS | 1 | |

120, 120, 120

123 ☐ Automatically generate input frequencies for each solution

Input Frequencies

[Add] 117  [Delete] 119  Double-click field to edit.

| Name | MHz | Available Count |
|---|---|---|
| input0 | 25 | 1 |

121

112

110

[Cancel] 132  [Generate Solutions] 130

Check Design Entry

Sever Test [Send] [Test Check Valid]    110

Max VCO Freq = 7500

Fixed Output Frequencies [Add] [Delete] Double-click field to edit.

| Name | MHz | Format | Count | Freq. Group |
|---|---|---|---|---|
| fixed0 | 24 | CMOS | 1 | |
| fixed1 | 27 | CMOS | 1 | |
| fixed2 | 25 | CMOS | 1 | |

120 → fixed0, fixed1, fixed2

Tunable Output Frequencies [Add] [Delete] Double-click field to edit.

| Name | Min MHz | Max MHz | Spacing MHz | Format | Count |
|---|---|---|---|---|---|

134

☐ Automatically generate input frequencies for each solution

Input Frequencies [Add] [Delete] Double-click field to edit.

| Name | MHz | Available Count |
|---|---|---|
| input0 | 25 | 1 |

121

Product Features | Generator Options ← 138b

138a

Applicable Devices: 38    Product Features

140 → 0 Delay
EEPROM
Pin Control
Jitter Cleaning

143 → [Add]    [Exclude] [Require] ← 144

Excluded Product Features ← 142

[Cancel]    [Generate Solutions]

Check Design Entry

Tunable Output Frequencies [Add] [Delete] Double-click field to edit.

| Name | Min MHz | Max MHz | Spacing MHz | Format | Count |
|------|---------|---------|-------------|--------|-------|

☐ Automatically generate input frequencies for each solution

Input Frequencies [Add] [Delete] Double-click field to edit.

| Name | MHz | Available Count |
|------|-----|-----------------|
| input0 | 25 | 1 |

~121

Product Features | Generator Options | Generator Testing

138b

Enter Part Filter: [LMK*]  [Apply] [Help]
Current Part Filter: LMK*          165
Max Solutions: [10 ▸]               167
☐ Validate Parts
☐ Show Part Validation

110

132 —[Cancel]   130 —[Generate Solutions]

Solution Report

Close

Solution Report
Created: Wed Oct 23 14:06:30 PDT 2013
Summary
1. Total Cost     $20.25
2. Total Area     163.00
3. Total Current     346.00
4. External Sources     none
5. Jitter Metric     90.00
Clock Devices
Name: LMK04100
  Cost:     $6.00
  Area:     49.00
  Current:     115.00
  Phase Noise:     -224.00
  VCO Noise:     -119.87
  Noise Floor:     -158.00
  For device details see datasheet
Name: LMK04100
  Cost:     $6.75
  Area:     49.00
  Current:     47.00
  Phase Noise:     0.00
  VCO Noise:     0.00
  Noise Floor:     -162.50
  For device details see datasheet
Name: LMK00105
  Cost:     $1.50
  Area:     16.00
  Current:     20.00
  Phase Noise:     0.00
  VCO Noise:     0.00
  Noise Floor:     -160.80
  For device details see datasheet Save 284

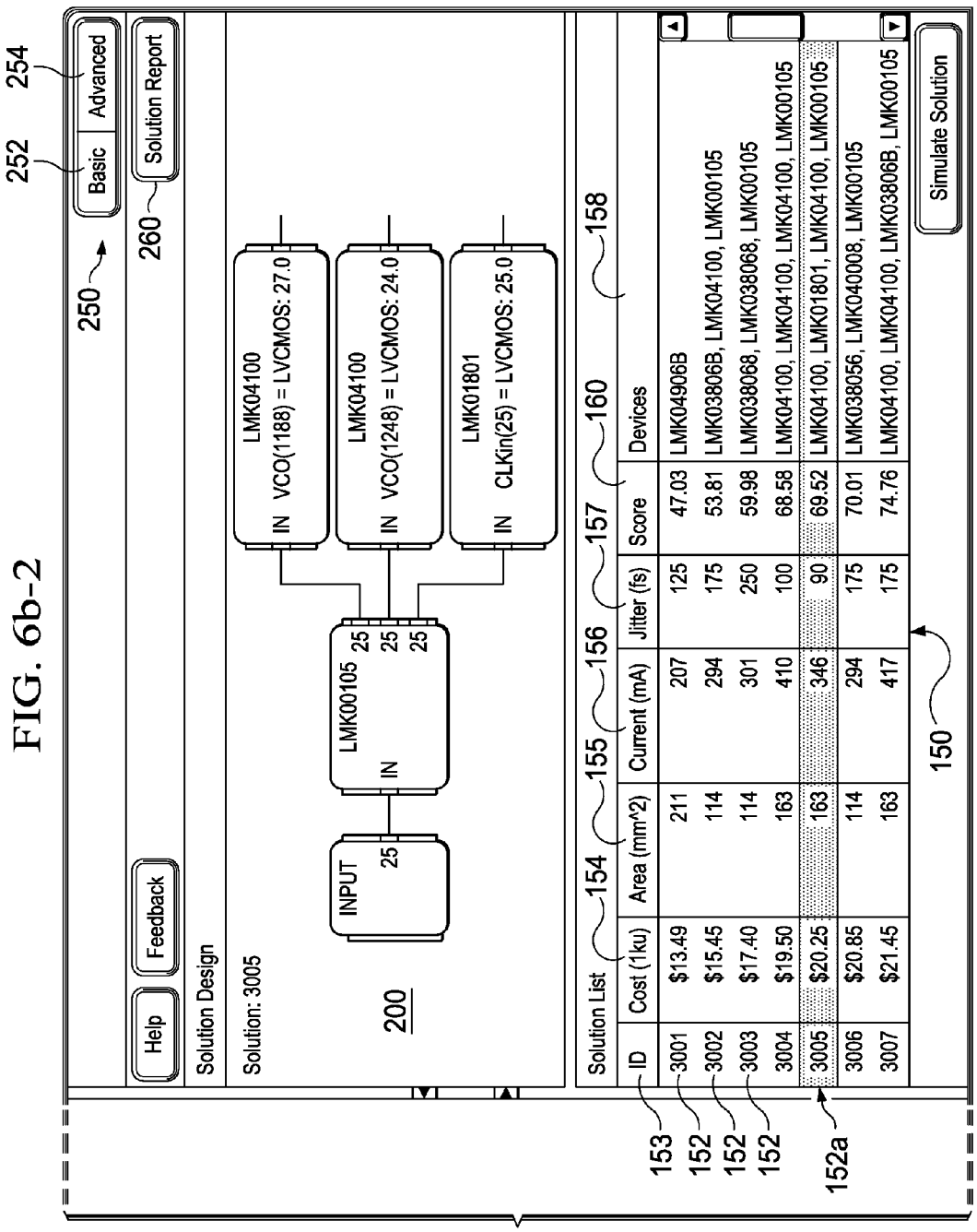

CLOCK TREE DESIGN

BACKGROUND

Most digital electronic systems use one or more clock signals to control their operation. It is not uncommon for a digital system to use multiple clock groups. A clock tree may have multiple and different frequencies. Each frequency or the tree as whole also may have special requirements such as maximum jitter, holdover, spread spectrum, instant on (comes on with no programming), and many other requirements.

Clocking devices typically contain a source frequency which is divided down by dividers in order to generate additional frequencies. For some clock trees, these frequencies might all nicely divide into a single frequency that can be generated by a source such as a VCO (Voltage Controlled Oscillator) of a device, while others might require multiple sources. Finding the right combination of devices and the best way to configure such devices is often time consuming and overwhelming due to the availability of a multitude of clock parts.

SUMMARY

In accordance with various embodiments, a non-transitory, computer readable storage device contains software that, when executed by a processor, causes the processor to receive input from a user via a graphical user interface (GUI) through a first window, the input including an indication of an output clock frequency. The software also causes the processor to detect selection by the user of a soft control and, as a result of detecting selection of the soft control, generate a plurality of clock tree solutions. The software further causes the processor to cause a graphical form of a highlighted one of the clock tree solutions to be displayed in a second window of the GUI.

In accordance with another embodiment, a method for designing a clock tree comprises receiving a plurality of clock tree requirements and, for each clock part in a database, determining if the clock part meets the plurality of clock tree requirements. The method further includes, if the clock part does not meet the plurality of clock tree requirements, computing a fitness score for the clock part and assign a fail tag to the clock part to generate a partial clock tree solution. The method also includes, starting with the partial clock tree solution having a most favorable fitness score, based on the fail tag for that partial clock tree solution, modifying the partial clock tree solution to include another clock part from the database to generate a modified partial clock tree solution.

Another embodiment is directed to a non-transitory, computer readable storage device containing software that, when executed by a processor, causes the processor to receive input from a user via a graphical user interface (GUI) through a first window, the input including an indication of an output clock frequency and a corresponding count for that output clock frequency. The software also causes the processor to generate a plurality of clock tree solutions and a fitness score for each clock tree solution, and to cause a graphical form of a highlighted one of the clock tree solutions to be displayed in a second window of the GUI.

BRIEF DESCRIPTION OF THE DRAWINGS

For a detailed description of exemplary embodiments of the invention, reference will now be made to the accompanying drawings in which:

FIGS. 1a and 1b show various embodiments of a clock tree design tool;

FIGS. 2a and 2b (collectively "FIG. 2") show a graphical user interface (GUI) in accordance with some embodiments to provide a basic user interface;

FIGS. 6a-1 and 6a-2 (collectively "FIG. 6a") and FIGS. 6b-1 and 6b-2 (collectively "FIG. 6b") illustrate a report generation capability of the clock tree design tool in accordance with various embodiments.

DETAILED DESCRIPTION

Figure 2B:
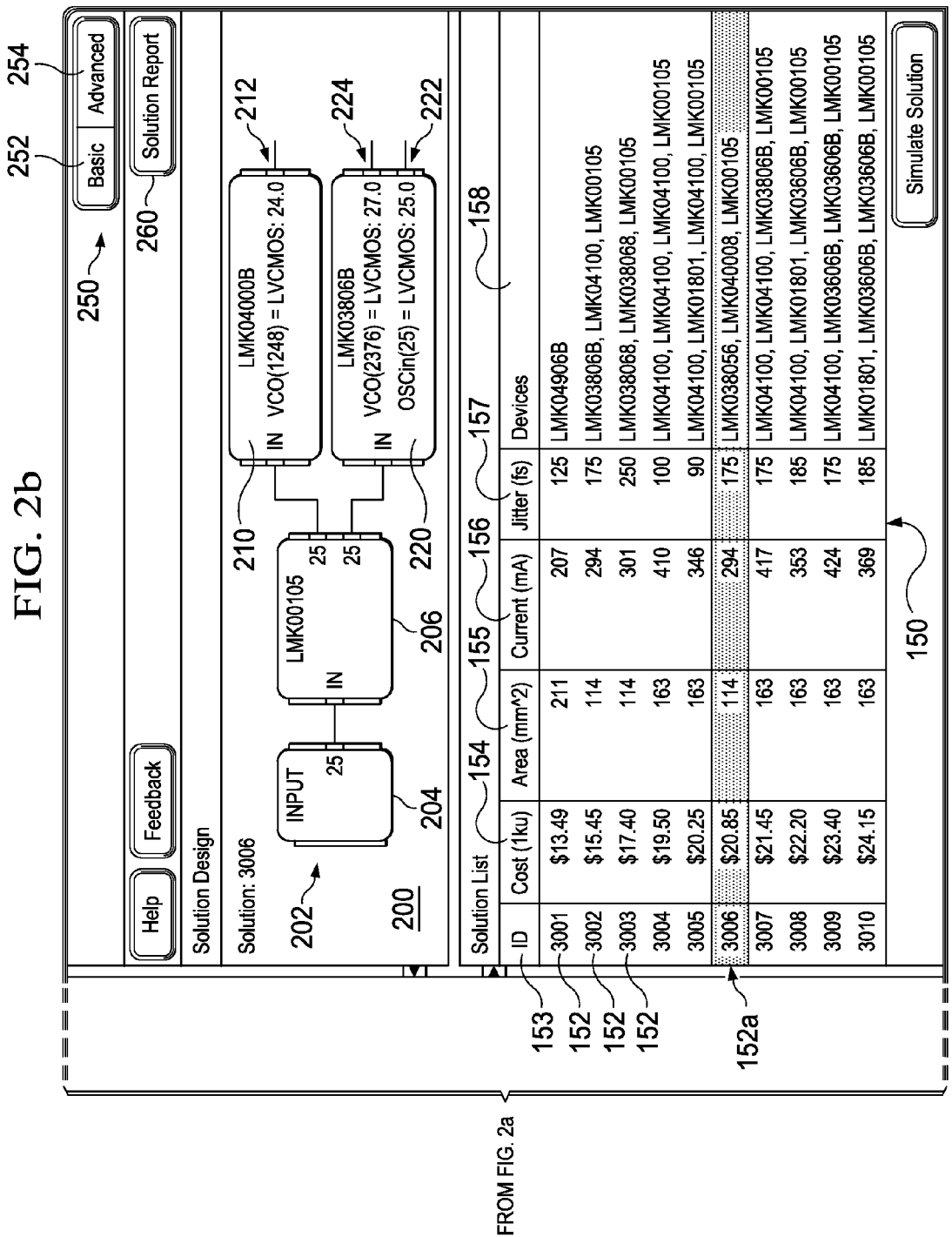

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The embodiments described herein are generally directed to a tool that is usable to design a clock tree. The tool may be a computer-implemented tool that may be accessible as a web application or as a stand-alone application. FIGS. 1a and 1b show examples of implementations of a system in accordance with various embodiments. FIG. 1a is a web application-based implementation, and FIG. 1b is a non-web application based implementation. As shown in FIG. 1a, a client device 10 is coupled to a server 20 via a network 19. The client device 10 includes a processor 12 which executes a browser 11. The processor 12 is coupled to an input device 14 (e.g., mouse, keyboard, etc.) and an output device 16 such as a display. Network interface 18 provides internet connectivity for the client device 10 to the network 19.

The server 20 includes a processor 24 coupled to the network 19 via a network interface 22. The server 20 includes a non-transitory computer readable storage device 26. Storage device 26 may comprise any suitable type of volatile or non-volatile storage such as any one or more of a hard disk drive, a compact disc read-only memory (CD ROM), random access memory, etc. The storage device 26 stores clock tree design code 28 and a clock parts database 30. The clock tree design code 28 is executable by processor 24 as a web application when accessed by client device 10 through the browser 11. The clock tree design code 26, upon being executed by processor 24 provides some or all of the functionality described herein.

FIG. 1b shows an implementation of computer 50 that includes a processor 52 coupled to an input device 54 (e.g., mouse keyboard) and an output device 56 (e.g., display). The processor 52 also is coupled to a non-transitory computer readable storage device 58 (random access memory, hard drive, etc.). The storage device 58 contains clock tree design code 60 and a clock parts database 70. The clock tree design code 60 preferably is executed by processor 52. One example of the system shown in FIG. 1b is a stand-alone computer (e.g., laptop, desktop, tablet, etc.), with or without network connectivity. In some examples, the clock parts database 70 may be stored remotely from the clock tree design code 60.

The functionality provided by the clock tree design code 28, 60 is mostly the same regardless of whether the code is executed as a web application by a server as a web service for a user (code 60), or on the user's computer itself (code 28). No distinction is made herein between either scenario in terms of the functionality provided by the clock tree design code. Any functionality, however, attributed to a web application context is applicable as well to a standalone execution of code 60 (FIG. 1b). All references to functionality performed by the clock tree design tool encompasses (a) the processor 52 executing clock tree design code 60 and/or (b) processor 24 executing clock tree design code 28 in concert with processor 12 executing web browser 11.

Figures 2, 3A:
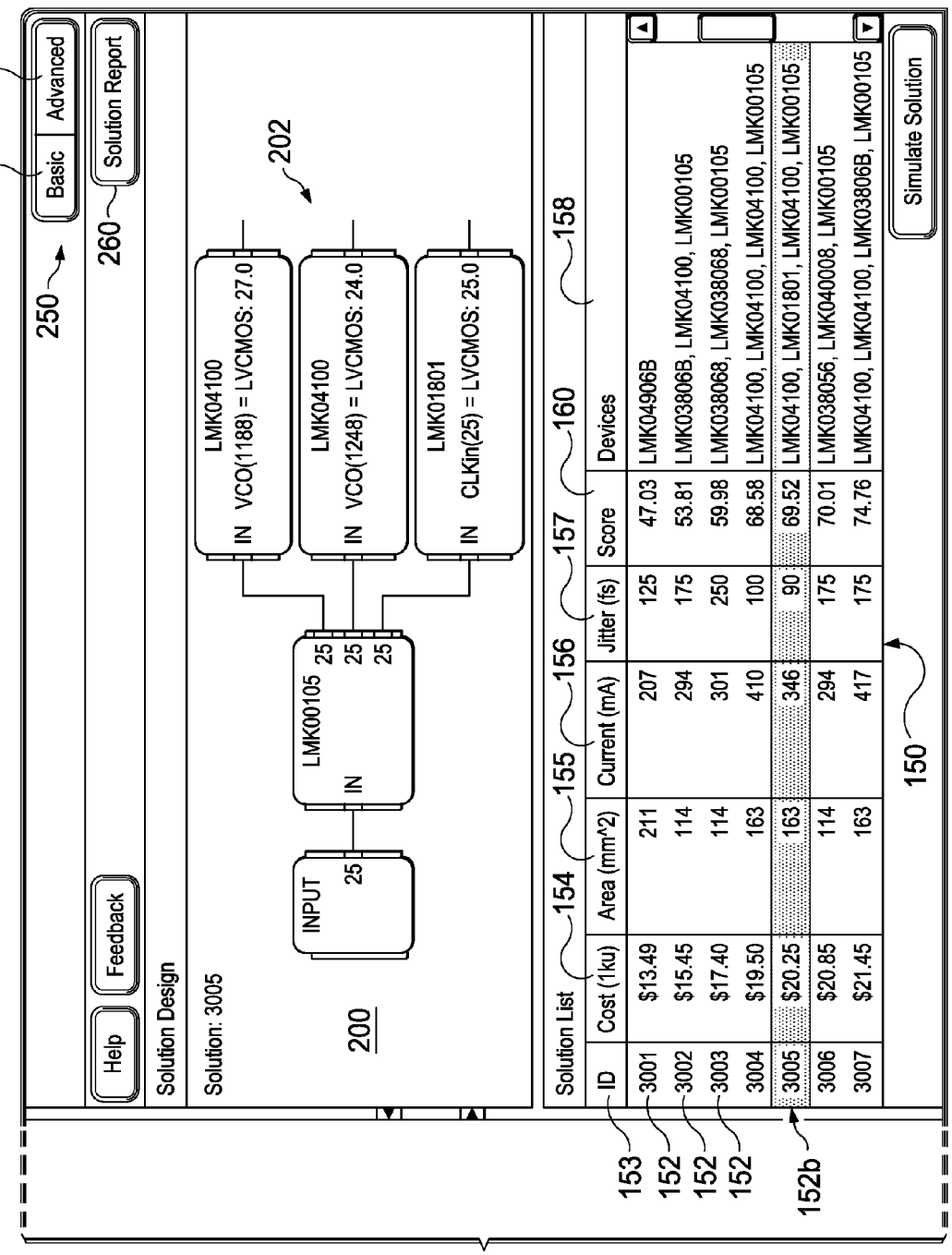
FIGS. 3a-1 and 3a-2 (collectively "FIG. 3a") and FIGS. 3b-1 and 3b-2 (collectively "FIG. 3b") show additional views of the GUI in accordance with various embodiments to provide an advanced user interface.

FIGS. 2-6 provide examples of screen shots of a graphical user interface (GUI) displayed to the user. Starting with FIG. 2, the illustrative GUI includes three windows 110, 150, and 200. Window 110 is used for the user to specify one or more input clock tree requirements for a desired clock tree to be designed. The clock tree design code generates one or more possible solutions based on the user-specified clock tree requirements and displays such clock tree solutions in window 150. The user then can highlight one of the displayed clock tree solutions in window 150 and the clock tree design code causes a graphical image 202 of the highlighted clock tree solution to be displayed in window 200. A mode input control 250 also is provided. The mode input control 250 preferably comprises a "basic" selection control 252 and an "advanced" selection control 254. FIG. 2 shows the functionality of the clock tree design code based on selecting the basic selection 252, while FIGS. 3a-5 show the functionality based on selecting the advanced selection 254.

Referring to FIG. 2, with basic selection control 252 selected, the input window 110 provides the user with the ability to add one or more desired input and output frequencies. Output frequencies can be added, deleted and displayed at 112 and input frequencies can be added, deleted and displayed at 121. To add an output frequency, ADD button 114 is selected and to delete a previously added output frequency, the DELETE button 116 is selected. The output frequencies that have been added are shown at 120. Three output frequencies have been added in the example of FIG. 2, but any number of output frequencies is possible. In the example of FIG. 2, the output frequencies are 24 MHz, 25 MHz, and 27 MHz. For each output frequency, the format of the output frequency is selectable and displayed (CMOS in this example) as well as the number of instances (count) of that frequency. Each of the 24, 25, and 27 MHz output frequencies have a single instance (count of 1) meaning that only one of each of the 24, 25, and 27 MHz output frequency is needed. In general, when adding an output frequency, the user can specify the frequency, the format, and the count for that frequency.

Selection button 123 can be selected to cause the clock tree design code to automatically determine a suitable input frequency(ies) and corresponding quantities (counts) for the desired output frequencies. If that button is not selected (as is the case in FIG. 2), then as shown at 121, one or more input frequencies can be added as desired by the user. In the example of FIG. 2, the user has added a single 25 MHz input frequency. The ADD button 117 is selected to add an input frequency and the DELETE button 119 is selected to delete a previously added input frequency.

Once the input and output frequencies are selected by the user, the user then selects the GENERATE SOLUTIONS button 130. The clock tree design code then performs an algorithm (an example of which is explained below) to generate one or more clock tree solutions. Each solution complies with the user's selected input parameters (e.g., input and output frequencies). The solutions draw from a database of clock parts (e.g., database 30, 70) and multiple solutions are possible.

Window 150 is populated with a list of the various clock tree solutions 152. Each clock tree solution includes an identifier (ID) 153, a cost 154, an area 155, a current 156, a jitter 157, and a list 158 of devices. The ID 153 may be any type of alpha numeric value that uniquely identifies that particular clock tree solutions. Ten clock tree solutions 152 are shown in the example of FIG. 2 and are designated with IDs 3001-3010. The list 158 of devices specifies the particular clock parts from a database that make up that particular solution. For example, highlighted clock tree solution 152a (ID 3006) comprises three parts listed as LMK03806B, LMK04000B, and LMK00105. Each part has a surface area which, when combined, is the area 155. Thus, the combined area of the three parts listed above is 114 square millimeters. The combined cost of the parts is provided as cost 154 (given, for example, for bulk quantities of 1000 parts). The combined cost for clock tree solution 3006 is $20.85. The total current draw (in units of milliamps) is provided as current 156, and is 295 mA for clock tree solution 3006. The jitter 157 represents the undesired deviation from true periodicity of an assumed periodic clock signal, and is 175 femtoseconds for clock tree solution 3006. Each clock tree solution 152 has a different combination of cost, area, current, jitter and devices.

The user is able to highlight any of the displayed clock tree solutions 152 and, as a result, the clock tree design code causes a graphical form of the highlighted solution to be displayed in window 200. In the example of FIG. 2, clock tree solution having ID 3006 has been highlighted and graphical form 202 is displayed in window 200. Graphical image 202 graphically shows the three parts comprising the highlighted clock tree solution—LMK03806B at reference numeral 220, LMK04000B at reference numeral 210, and LMK00105 and reference numeral 206. Reference 204 illustrates a clock source such as a crystal oscillator to generate the input 25 MHz clock. Graphical depictions of the parts are shown along with interconnecting lines illustrating how the various parts are to be electrically connected together to form the solution and thereby achieve the user's input and output frequency requirements. In window 110, the user specified that the clock tree solution should have at least one each of a 24 MHz clock, a 25 MHz clock, and a 27 MHz clock. In window 200, the 24 MHz clock is provided at output 212 while the 25 MHz and 27 MHz clocks are provided at outputs 222 and 224, respectively. If the user were to highlight a different clock tree solution 152 in window 150, a different graphical image 202 would automatically be displayed in window 200 corresponding to the highlighted solution.

The GUI shown in FIG. 2 is an example of a GUI based on the user selecting the "basic" selection control 252. FIG. 3a illustrates a GUI based on the user selecting the "advanced" selection control 254. The differences between the advanced GUI of FIG. 3a and the basic GUI of FIG. 2 includes additional input controls in the advanced GUI that are not available in the basic GUI. For example, user input window 110 in the advanced GUI of FIG. 3a includes the same user input areas 120 and 121 for the user to specify desired output and input frequencies and quantities, respectively. However, input window 110 also includes an area 134 for the user to specify various tunable output frequencies. A tunable output frequency is an output frequency with a nominal frequency but a frequency that can be adjusted based on, for example, a user programming a register.

Figures 1, 3B:
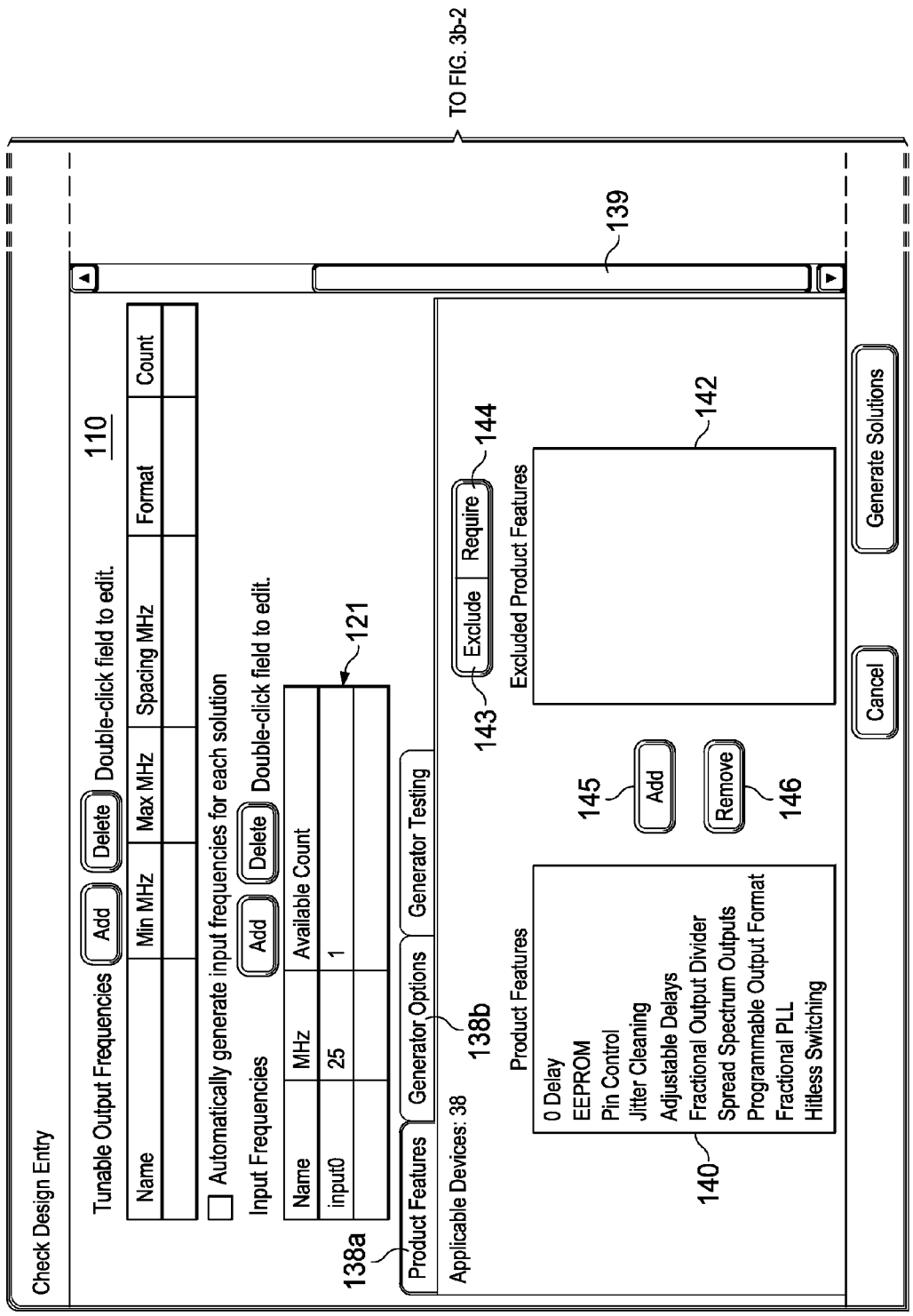
Figures 2, 3B:
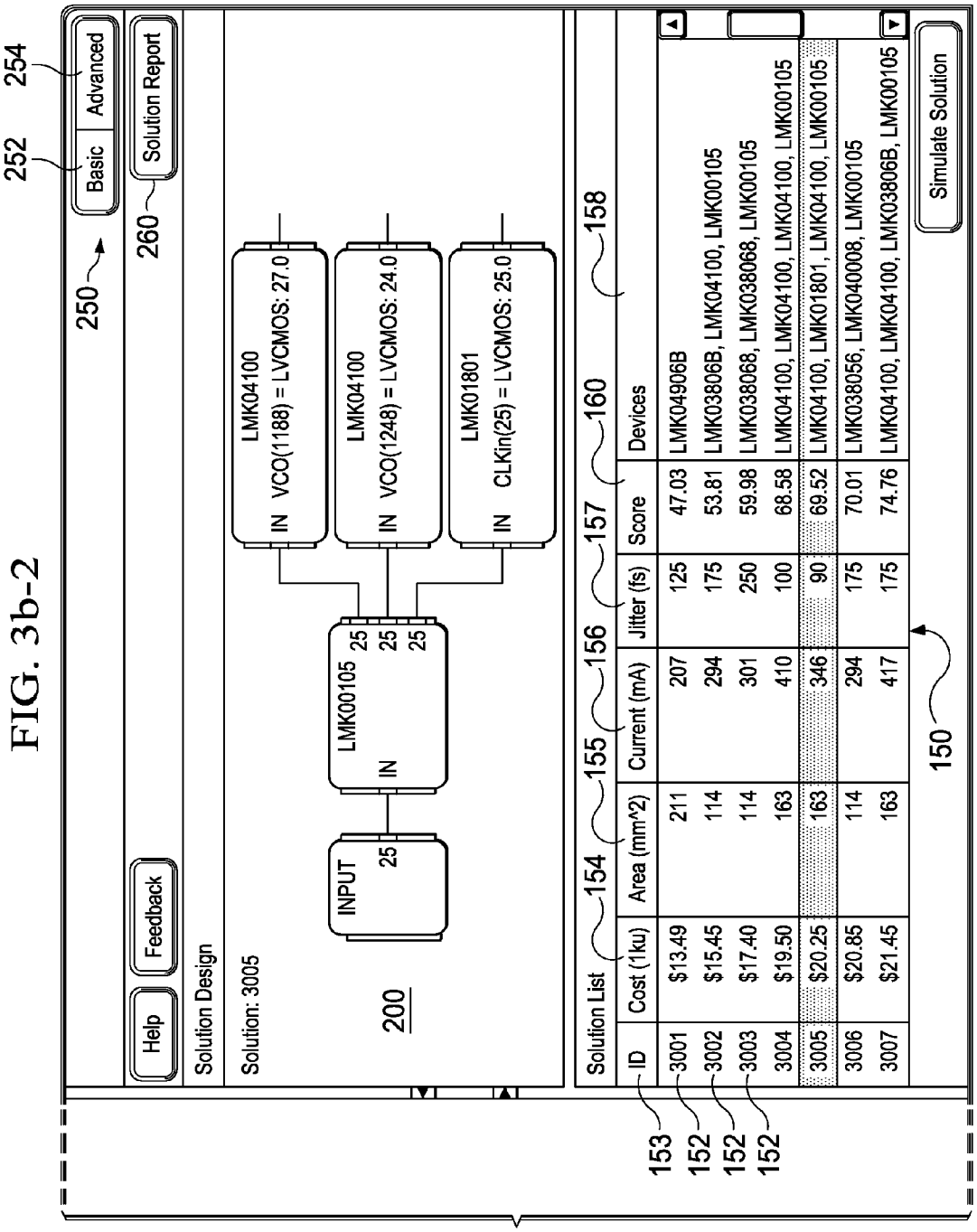

In additional, input window 110 of the advanced GUI of FIG. 3a includes selectable tabs 138a and 138b. Tab 138a permits a user to specify various product features of interest and tab 138b permits a user to select from among various other options. FIG. 3b better illustrates the control the user has over the product features upon selecting tab 138a. The GUI of FIG. 3b is identical to that of FIG. 3a except that the user has moved scroll bar 139 downward so that the available product features can be fully viewed. The product features 140 in accordance with the preferred embodiments include:

0-Delay: devices with 0-Delay have a deterministic delay between the input and the output clocks EEPROM: devices with EEPROM have an EEPROM on board so that they do not require programming Pin Control: devices with pin control can have their settings determined by pins instead of programming interface Jitter Cleaning: devices with jitter cleaning can clean up the noise of the input signal, for example, low offset phase noise such as noise below 10 kHz Adjustable Delays: Adjustable delays allow the user to change the phase relationship between the outputs Fractional Output Divider: fractional output dividers allow the voltage controlled oscillator (VCO) frequency to be divided by a non-integer value.

Spread Spectrum Outputs: spread spectrum outputs dynamically modulate the output frequency (often a triangle wave) to minimize the electromagnetic interference (EMI)

Programmable Output format: programmable output format allows the user to have more than one output supported by the same pin Fraction Phase Lock Loop (PLL): fractional phase locked loops have a fractional N divider that allows a higher phase detector frequency, which in turn can lead to improved jitter Hitless Switching: Hitless switching refers to the ability to change between two or more different input clocks with a minimum disturbance at the output The user can highlight any of the product features 140 and then select the "add" control 145 to have the product feature added to window 142. If the "exclude" control 143 is selected, then the product features listed under "product features" 140 are all required but any such feature can be excluded by adding it to the "Excluded Product Features" 142. Alternatively, the "require" control 144 can be selected which means results in all of the product features listed under product features 142 are excluded, but any of such features can be added to window 142 which, in this case, contains required features. The label for window 142 in this case will change from "Excluded Product Features" to "Required Product Features."

Figure 4A:
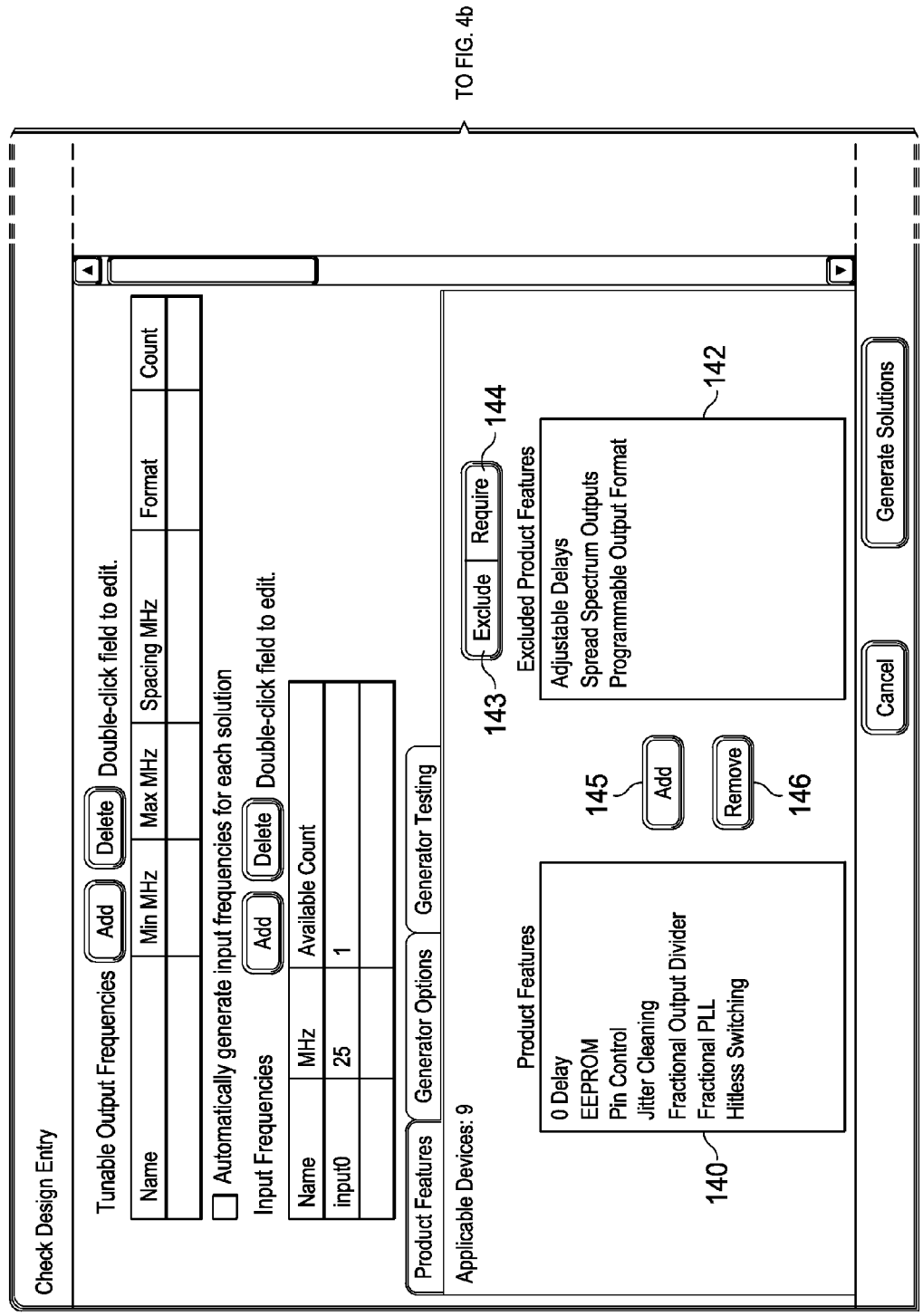
FIGS. 4a and 4b (collectively "FIG. 4") and FIGS. 5a and 5b (collectively "FIG. 5") illustrate further input capabilities for the advanced user interface.
Figure 4B:
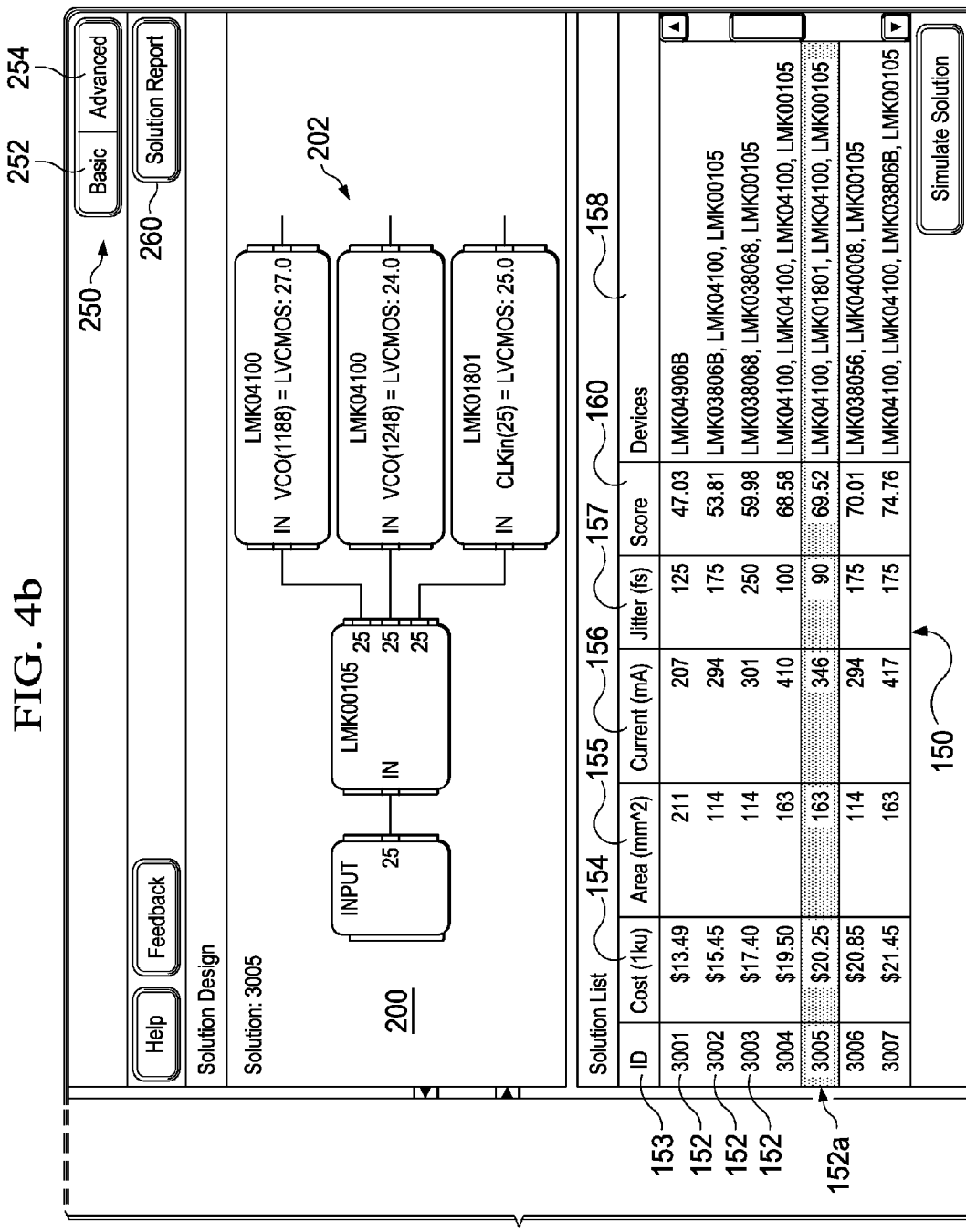

FIG. 4 shows another view of the advanced GUI in which several product features have been added to the Excluded Product Features list 142, namely, the Adjustable Delays, Spread Spectrum Outputs, and Programmable Output Format features. In this example, these particular product features are not to be included in the clock tree solutions per the user's requirements.

Another difference between the basic GUI of FIG. 2 and the advanced GUI of FIGS. 3a and 3b is that, for each listed clock tree solution 152, an additional piece of information is displayed. In some embodiments, the additional piece of information is a "score" 160 (also called a fitness score) which is computed by the clock tree design code for each clock tree solution. In at least some embodiments, the fitness score for a given clock tree solution is computed as a weighted average of the cost 154, the area 155, the current 156, and the jitter 157. The weights may any suitable weights such as 25% for the cost, 25% for the area, 25% for the current, and 25% for the jitter, although the weights can be other than equal weights for each parameter. All else being equal, the fitness score will be lower for a given cost solution relative to another solution if any of the given solution's cost, area, current, or jitter values are lower than the other solution. That is, a clock tree solution that has the lowest fitness score may be considered the optimal or preferred clock solution. Of course, the user is free to select a clock tree solution that does not have the lowest (i.e., best fitness score).

Any of the headings at the top of the list of clock tree solutions can be selected to sort the displayed list of clock tree solutions.

Figure 5B:
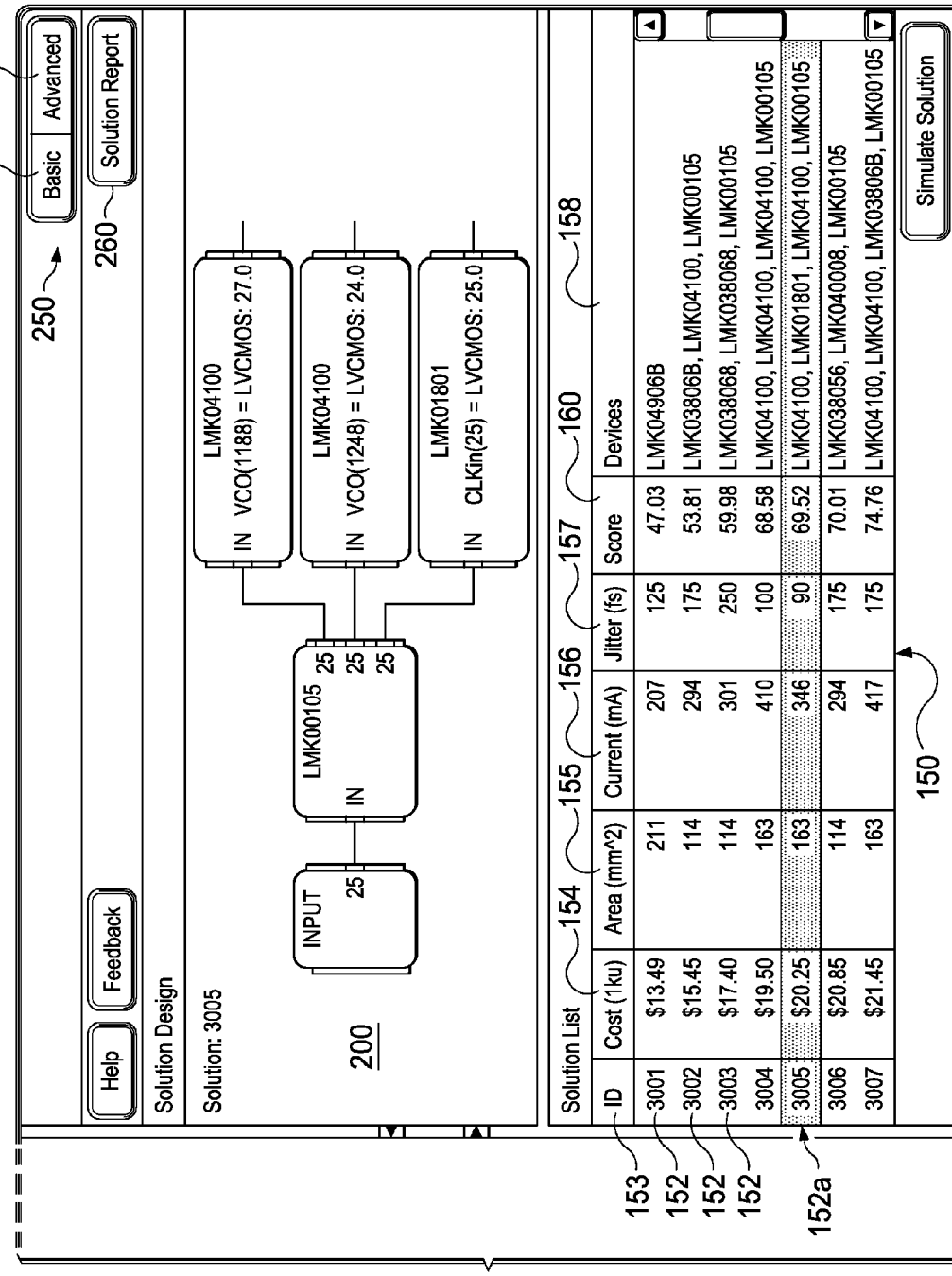

FIG. 5 illustrates the operation of the clock tree design code upon the user selecting the "generator options" tab 138b in window 110. These options, for example, permit a user to filter which parts from the clock parts database are accessible to generate the various solutions. In the example of FIG. 5, at 165 the user has specified that only parts whose names begin with "LMK" are permitted to be used. At 167, the user can also specify the number of possible clock tree solutions 152 that the user wishes to see in window 150.

Figures 1, 6A:
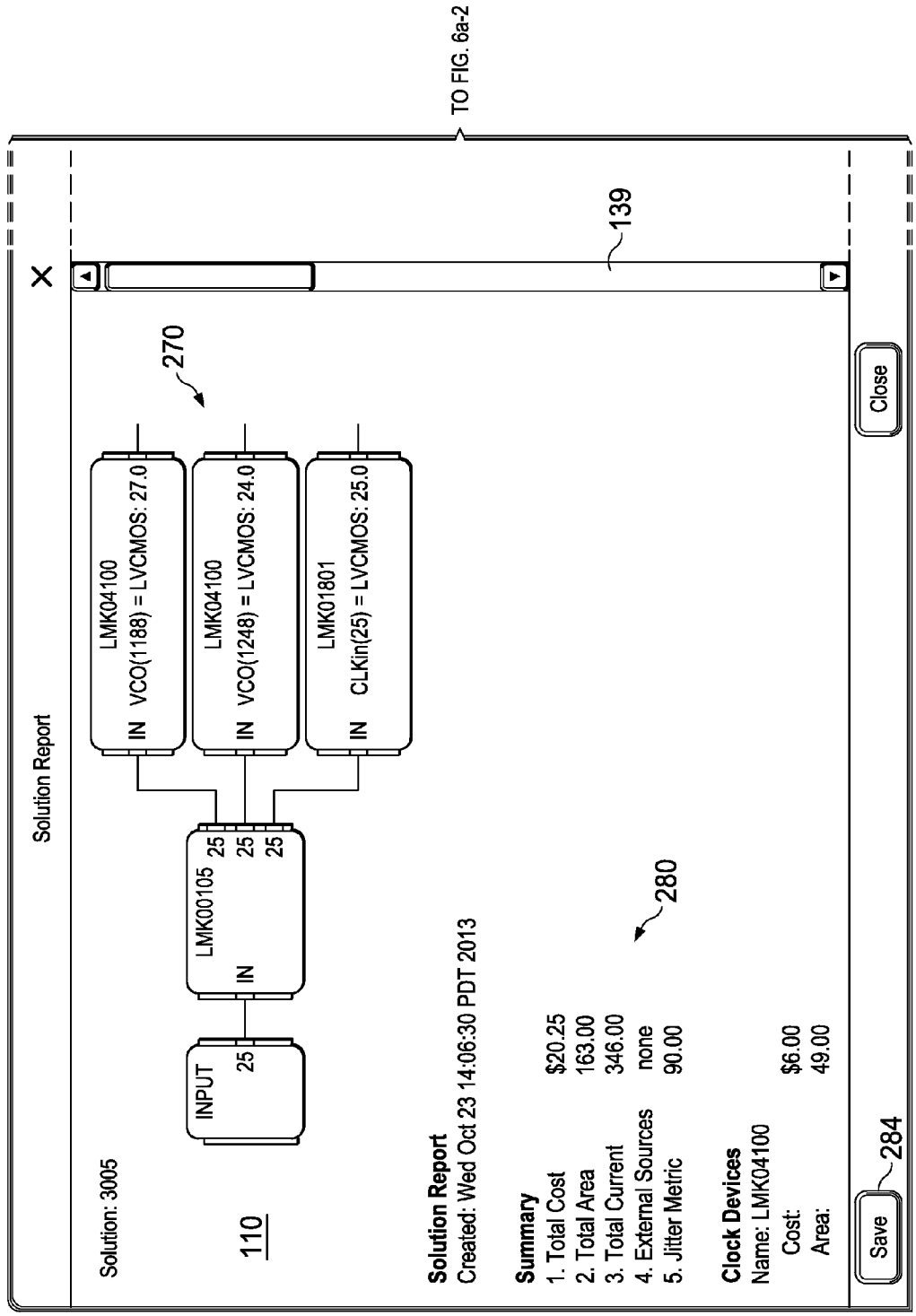
Figures 2, 6A:
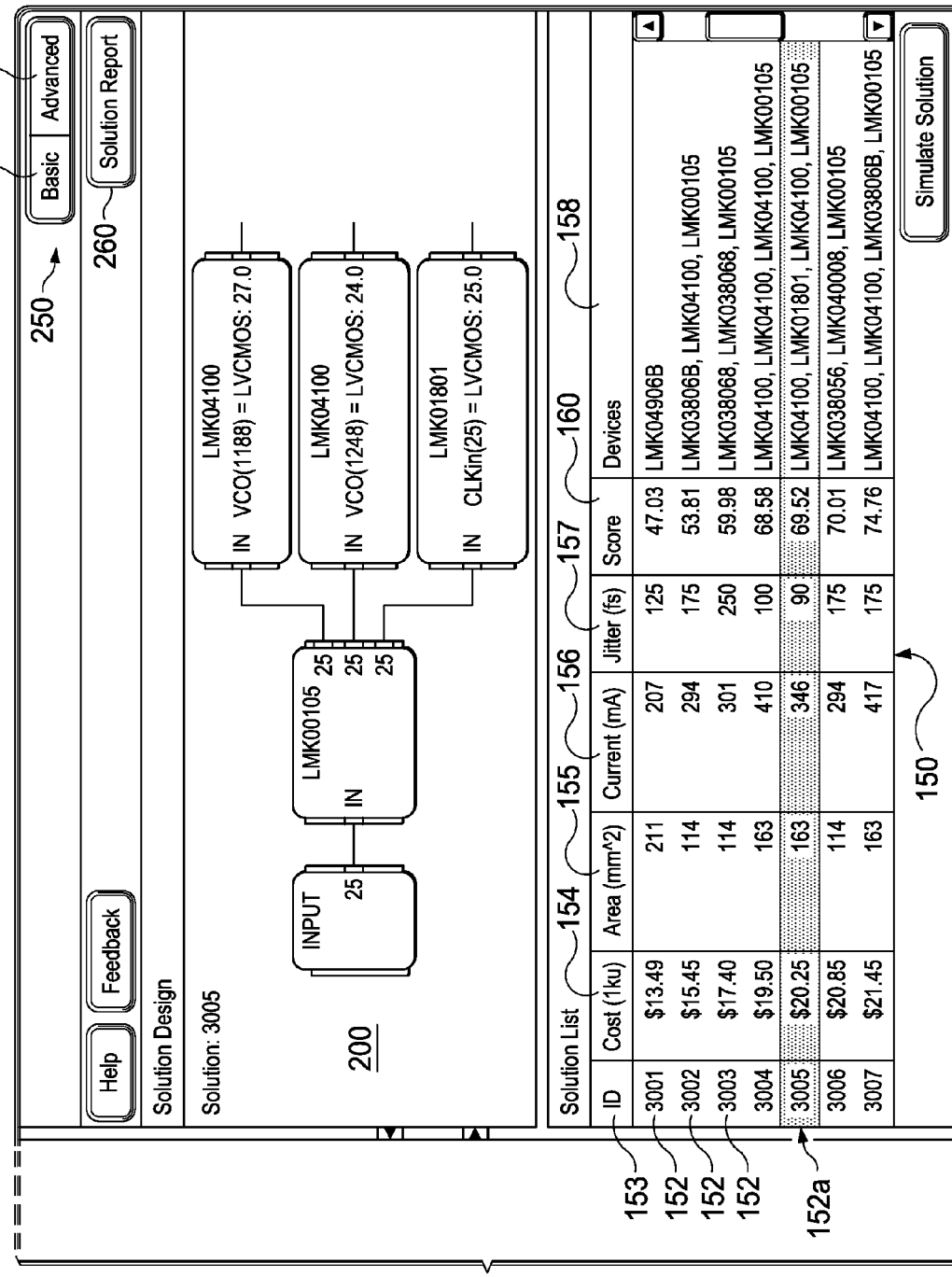

FIGS. 2, 3a, 3b, and 4 show a "Solution Report" button 260. FIGS. 6a and 6b illustrate the operation of the clock tree design code upon the user selecting the Solutions Report button 260. Upon selecting the Solutions Report button 260, whichever clock tree solution 152 is currently highlighted will be displayed in a report format in window 110. The scroll bar 139 may be moved to see the full report and thus pat of the report is viewable in FIG. 6a and the rest in FIG. 6b. The illustrative report includes a graphical depiction 270 of the highlighted clock tree solution along with a summary of the particular parameters (cost, area, current, and jitter) at 280. As best seen in FIG. 6b, information about each part in the particular clock tree solution is also displayed. A user can then save the report by selecting the "save" button 284. The report will then be saved into a suitable format such as HTML, PDF, etc.

Figure 7:
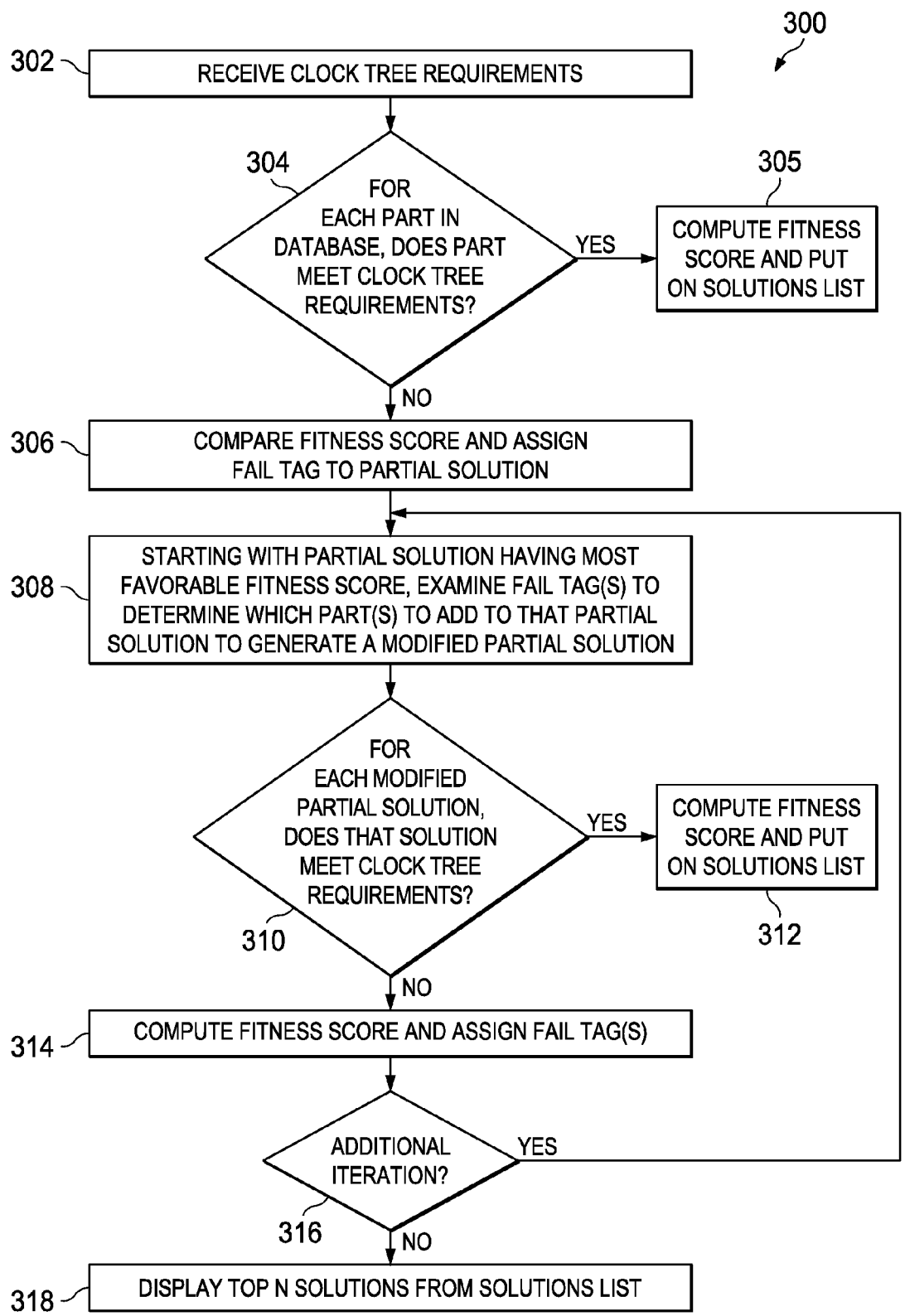
FIG. 7 shows a method in accordance with various embodiments.

FIG. 7 illustrates a method 300 implemented by, for example, a processor executing the clock tree design code and/or browser that interacts with the clock tree design code. The various operations can be performed in the order shown or in a different order.

At 302, the method includes receiving clock tree requirements. In the example above, such clock tree requirements are input or otherwise selected by a user via input window 110. The clock tree requirements include such requirements, as output clock frequencies, the number of instances of each output clock frequency, tunable output frequencies, product features, etc.

At 304, the method includes, for each clock part in the database (30, 70), determining whether that part alone meets the user-specified clock tree requirements. If a part does meet the clock tree requirements, a fitness score is computed for that part (now termed a clock tree solution) and placed on a solutions list. If a part does not meet the clock tree requirements, then at 306, a fitness score is computed anyway and the partial solution (partial in that the part does not meet all of the clock tree requirements) is assigned a fail tag. Examples of fail tags include:

Input Frequency Mismatch: the input to the device does not support the frequency with which it is being driven Source Frequency Mismatch: the source cannot produce the frequency that is trying to be assigned to it Source Frequency Division: although the source can produce a multiple of the frequency requested, it does not have sufficient divide values to produce the actual recommend frequency Check Output Pins: there are not enough output pins Check Enough Output Formats: the solution does not have enough of the required output formats Configure Source If No Fail Tags The fitness score for a partial solution may include a weighted average of cost, area, current, and jitter as noted above as well as include a value indicative of the fail tag. For example, all fail tags may correspond to a value of 1000 or different fail tags may correspond to different values (e.g., Input Frequency Mismatch and Source Frequency mismatch may correspond to a value of 500, while the Check Output Pins fail tag may correspond to a value of 1000). These fail tag values are added to the weighted average of cost, area, current, and jitter or may be included in the weighted average itself. A given partial clock tree solution may multiple fail tags assigned to it, that is, there may be multiple reasons why the solution failed to meet the user-specified requirements. In such cases, the values corresponding to each such fail tag may be added together to form the fitness score for that partial solution. In general, the fail tag values increase the fitness score to further differentiate partial solutions from solutions that fully comply with the user-specified clock tree requirements. The fail tag labels or identifiers otherwise indicative of the fail tag may be stored with the partial solution.

After 306 is performed, some or all parts in parts database have been analyzed for compliance with the user-specified requirements and a fitness score has been computed for all such parts. Those solutions that fully comply with the user-specified clock tree requirements have been stored to the solutions list and those that are only partial solutions are further analyzed as follows.

At 308, starting with the partial solution having the most favorable fitness score (e.g., the lowest fitness score), the method includes examining the fail tag(s) of the partial solution and determining which part(s) to add to that partial solution in attempt to turn the partial solution into a solution that fully complies with the user-specified requirements. The resulting modified partial solution is referred to as a "modified partial solution." For example, if a fail tag for a partial solution indicates that it does not have enough outputs, a buffer may be added to that partial solution in attempt to remedy this problem. The clock tree design code may be pre-programmed to use certain parts from the database based on certain fail tags.

At 310, a determination is made as to whether each modified partial solution meets the user-specified clock tree requirements. At 312, a fitness score is computed for each modified partial solution that does meet the user's requirements and is that solution is then placed on the solutions list.

For the remaining modified partial solutions (solutions that do not fully comply with the user-specified clock tree requirements), the method continues at 314 at which a fitness score is computed for the modified partial solutions and a new fail tag(s) is(are) assigned to the modified partial solution depending on the nature of its failure to comply with the user's requirements. The fitness score is computed based on cost, area, current, jitter, and values corresponding to the fail tags as explained above with respect to operation 306.

The process described above is an iterative process and may iterate until a stop condition is reached, such as a specific number of iterations. If the stop condition has not yet been reached, control loops back to operation 308 and the process repeats. Once the stop condition is reached, as determined at 316, the clock tree design code causes the top n clock tree solutions from the solutions list to be displayed in window 150. The value of n may be configured by the user at 167 in FIG. 5. The order of the clock tree solutions may be based on the fitness scores for the solutions. For example, the top 10 clock tree solutions from the solutions list are the 10 clock tree solutions that have the lowest fitness scores.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A non-transitory, computer readable storage device containing software that, when executed by a processor, causes the processor to:
   receive input from a user via a graphical user interface (GUI) through a first window, the input including an indication of an output clock frequency;
   detect selection by the user of a soft control;
   as a result of detecting selection of the soft control, generate a plurality of clock tree solutions; and
   cause a graphical form of a highlighted one of the clock tree solutions to be displayed in a second window of the GUI,
   wherein the software causes the processor to cause the plurality of clock tree solutions to be displayed in a third window of the GUI,
   wherein, for each clock tree solution, the software causes the processor to display a solution identifier, a cost, an area, a current, and a jitter.

2. The non-transitory, computer readable storage device of claim 1 wherein, for each clock tree solution, the software causes the processor to display at least one of a solution identifier, a cost, an area, a current, a jitter, and a fitness score.

3. The non-transitory, computer readable storage device of claim 1 wherein, for each clock tree solution, the software causes the processor to display a solution identifier, a cost, an area, a current, a root mean square (RMS) jitter, a fitness score, and a parts list.

4. The non-transitory, computer readable storage device of claim 3 wherein the software causes the processor to calculate the fitness score for each clock tree solution as a weighted average of the cost, the area, the current, and the RMS jitter.

5. The non-transitory, computer readable storage device of claim 1 wherein the software causes the processor to permit a user to highlight any of the displayed clock tree solutions with a graphical form of the highlighted clock tree solution being displayed in the second window.

6. The non-transitory, computer readable storage device of claim 1 wherein the graphical form of the highlighted clock tree solution includes one or more parts, and if multiple parts are included, inter-part connections.

7. The non-transitory, computer readable storage device of claim 1 wherein the software causes the processor to receive a mode input from a user, the mode input including a selection of first mode and a second mode, the second mode providing more input choices than the first mode, wherein the first mode causes the user to be able to identify the plurality of output clock frequencies, and the second mode causes the user to be able to identify the plurality of output clock frequencies as well as select any of multiple parameters displayed in the first window.

8. The non-transitory, computer readable storage device of claim 7 wherein the multiple parameters include any one or more of 0 delay, EEPROM, pin control, fractional PLL, jitter cleaning, hitless switching, adjustable delays, fractional output divider, spread spectrum outputs, and programmable output format.

9. The non-transitory, computer readable storage device of claim 1 wherein the software causes the processor to receive a plurality of clock tree requirements including an indication of a plurality of output clock frequencies and to generate the plurality of clock tree solutions by:
for each clock part in a database, determining if the clock part meets the plurality of clock tree requirements;
if the clock part does not meet the plurality of clock tree requirements, computing a fitness score for the clock part and assign a fail tag to the clock part to generate a partial clock tree solution; and
starting with the partial clock tree solution having a most favorable fitness score, based on the fail tag for that partial clock tree solution, modifying the partial clock tree solution to include another clock part from the database to generate a modified partial clock tree solution.

10. The non-transitory, computer readable storage device of claim 9 wherein the software causes the processor to compute a fitness score for each modified partial clock tree solution and to determine if each such modified partial clock tree solution satisfies the plurality of clock tree requirements, and if a modified partial clock tree solution does not satisfy the plurality of clock tree requirements, to assign a fail tag to the modified partial clock tree solution.

11. The non-transitory, computer readable storage device of claim 10 wherein the fail tag indicates a reason for why the clock part or modified partial clock tree solution fails to satisfy the plurality of clock tree requirements.

12. A method for designing a clock tree, comprising:
receiving a plurality of clock tree requirements;
for each clock part in a database, determining if the clock part meets the plurality of clock tree requirements;
if the clock part does not meet the plurality of clock tree requirements, computing a fitness score for the clock part and assign a fail tag to the clock part to generate a partial clock tree solution; and
calculate a fitness score for each clock tree solution based on at least one of: a cost, an area, a current, and a jitter value;
starting with the partial clock tree solution having a lowest fitness score, based on the fail tag for that partial clock tree solution, modifying the partial clock tree solution to include another clock part from the database to generate a modified partial clock tree solution, and
displaying clock tree solutions in a graphical user interface (GUI).

13. The method of claim 12 further comprising:
computing a fitness score for each modified partial clock tree solution;
determining whether each such modified partial clock tree solution satisfies the plurality of clock tree requirements; and
if a modified partial clock tree solution does not satisfy the plurality of clock tree requirements, assigning a fail tag to the modified partial clock tree solution.

14. The method of claim 12 wherein receiving the plurality of clock tree requirements includes receiving at least one of an input frequency, an indication an output frequency, and a number of output frequencies.

15. The method of claim 12 wherein computing the fitness score comprises computing a value based on cost, area, current, RMS jitter, and a reason for why the clock part does not meet the plurality of clock tree requirements.

16. A non-transitory, computer readable storage device containing software that, when executed by a processor, causes the processor to:
receive input from a user via a graphical user interface (GUI) through a first window, the input including an indication of an output clock frequency and a corresponding count for that output clock frequency;
generate a plurality of clock tree solutions and a fitness score for each clock tree solution; and
cause a graphical form of a highlighted one of the clock tree solutions to be displayed in a second window of the GUI,
wherein the software causes the processor to calculate the fitness score for each clock tree solution based on at least one of: a cost, an area, a current, and a jitter value.

17. The non-transitory, computer readable storage device of claim 16 wherein the software causes the processor to receive a plurality of clock tree requirements from the user including an indication of a plurality of output clock frequencies and to generate the plurality of clock tree solutions by:
for each clock part in a database, determining if the clock part meets the plurality of clock tree requirements;
if the clock part does not meet the plurality of clock tree requirements, computing the fitness score for the clock part and assign a fail tag to the clock part to generate a partial clock tree solution; and
starting with the partial clock tree solution having a lowest fitness score, based on the fail tag for that partial clock tree solution, modifying the partial clock tree solution to include another clock part from the database to generate a modified partial clock tree solution.

* * * * *